United States Patent [19]

Herold

[11] Patent Number: 5,051,881
[45] Date of Patent: Sep. 24, 1991

[54] VOLTAGE MULTIPLIER

[75] Inventor: Barry W. Herold, Boca Raton, Fla.

[73] Assignee: Motorola, Inc., Schaumburg, Ill.

[21] Appl. No.: 548,479

[22] Filed: Jul. 5, 1990

[51] Int. Cl.[5] .......................................... H02M 3/107
[52] U.S. Cl. ...................................... 363/60; 363/59; 320/1
[58] Field of Search .................... 363/59, 60; 307/110; 320/1

[56] References Cited

U.S. PATENT DOCUMENTS 4,053,821 10/1977 Hose, Jr. et al. ...................... 363/60
4,344,003 8/1982 Harmon et al. ................. 307/296 A
4,621,315 11/1986 Vaughn et al. ........................ 363/60

OTHER PUBLICATIONS

Intersil CMOS Data Book, 1983/1984, pp. 5-104 to 5-110, discusses the ICL7660 Voltage Converter.

Primary Examiner—Steven L. Stephan
Assistant Examiner—Bruce Dunn
Attorney, Agent, or Firm—William E. Koch; Vincent B. Ingrassia

[57] ABSTRACT

A voltage multiplier selectively couples an input voltage potential (10) from a voltage source (Vin) to an energy storage device (22) in response to a first control circuit (18). A second switching circuit (26) is used to selectively serially couple the first energy storage device (22) and the voltage source (10) to provide an intermediate voltage potential (Vin), which is selectively coupled to a second energy storage device (30) in response to a second control signal (28') that is provided by a second control circuit (38) coupled to the intermediate voltage potential (Vim). The output of the second energy storage device (30) comprises an output voltage potential (Vout) being greater than the input voltage potential (Vin).

7 Claims, 3 Drawing Sheets

VOLTAGE MULTIPLIER

FIELD OF THE INVENTION

This invention relates in general to the field of voltage multipliers, and more specifically to those voltage multipliers capable of low voltage operation so as to be suitable for use in selective call receivers.

BACKGROUND OF THE INVENTION

Voltage multiplying (e.g., voltage doubling), circuits are commonly used in low power portable communication devices (e.g., selective call receivers), to raise an incoming battery voltage (nominal 1.5 volts) up to an operating voltage of approximately 3.0 volts for a CMOS microcomputer and associated logic circuits. Since CMOS current requirements are typically very low (unit milliamps or less), the battery and voltage multiplying circuits can usually supply the higher voltage at the rated current load.

A typical topology of conventional voltage multiplying circuits includes switching circuits to selectively transfer an input voltage potential to an intermediate energy storage device, such as a capacitor. Additional switching circuits serially couple the intermediate voltage potential of the first energy storage device and the input voltage potential to a second "output" energy storage device. The rate at which the output voltage potential approaches twice that of the input voltage potential typically depends on the switching speed of the switching circuits, the capacity of the energy storage devices (i.e., the size of the capacitors), and the current handling capability of the switching circuits. Normally, the switching circuits are controlled by control circuits that receive timing signals from a timing circuit; all powered from the input voltage source. Although, in some conventional designs a "bootstrap" control circuit is powered from the output voltage to enhance the current handling capability of the switching circuits, as is subsequently described herein.

Referring to FIG. 1, a conventional configuration for a voltage multiplying (doubling) circuit is shown. An incoming voltage (Vin) at an input 10 is selectively transferred to an energy storage device, such as provided by capacitor 22, using switching devices (12 and 14). The switching devices (12 and 14) typically comprise MOS transistors and respond to a control signal 16, which is generated by a control circuit 18. In similar fashion, switching devices (24 and 26) respond to a control signal 28 from control circuit 20. Control circuits 18 and 20 are configured as sequential inverters (or optionally as non-overlapping timing generators), such that the control signals 16 and 28 are always the complement of each other. Therefore, when switching devices (12 and 14) are "closed" switching devices (24 and 26) are "open", and vice versa. In the latter case, the intermediate voltage potential across the capacitor 22 is selectively serially coupled to, or superimposed on top of (added to), the input voltage potential (Vin), and presented to a second "output" energy storage device, such as provided by a capacitor 30. Lastly, timing signals from a timing circuit (not shown) are routed to the control circuits (18, 20, 32, and 34) via an input 40 to control the switching speed of the switching circuits (12, 14, 24, and 26).

In this configuration, when the output voltage potential (Vout) increases above a minimum operational voltage threshold for control circuits (32 and 34), control signals (16' and 28') supplement the control signals (16 and 28). The combined control signals (16, 16', 28, and 28') drive the switching devices (12, 14, 24, and 26) harder (more fully conductive) and improve their current handling capability. Therefore, as the "output" voltage potential (Vout) across capacitor 30 increases above a minimum threshold, the increased current handling capability of the switching devices (12, 14, 24, and 26) increases the rate at which the output voltage potential (Vout) approaches twice that of the input voltage potential (Vin). Hence, the efficiency of the voltage multiplying circuits is improved when control circuits (32 and 34) begin to provide additional control signals (16' and 28').

Besides increasing the rate at which the "output" voltage potential (Vout) approaches twice that of the input voltage potential (Vin), a second important requirement demands the overall lower voltage operation for voltage multiplying circuits. Conventional designs require typically 1.5 volts (and higher) for the input voltage (Vin). Below that range, the control circuits (18, 20, 32, and 34) as well as the switching devices (12, 14, 24, and 26) normally will not operate efficiently, if at all. Specifically, the control circuits (18 and 20) may operate, however the switch resistance may be too high for startup of normal multiplier operation. With the ever increasing demand for longer battery life, which is directly affected by the operational range of the voltage multiplying (doubling) circuits, it is regrettable that no known configuration exists to improve the minimum operational voltage threshold substantially below the conventional range.

SUMMARY OF THE INVENTION

In carrying out one form of the invention, there is provided a voltage multiplier that selectively couples an input voltage potential from a voltage source to an energy storage means in response to a first control means coupled to the voltage source. A second switching means is used to selectively serially couple the energy storage means and the voltage source to provide an intermediate voltage potential, which is selectively coupled to a second energy storage means in response to a second control signal. The second control signal is provided by a second control means coupled to the intermediate voltage potential. The output of the second storage means comprises an output voltage potential being greater than the input voltage potential.

DESCRIPTION OF A PREFERRED EMBODIMENT

Figure 2:
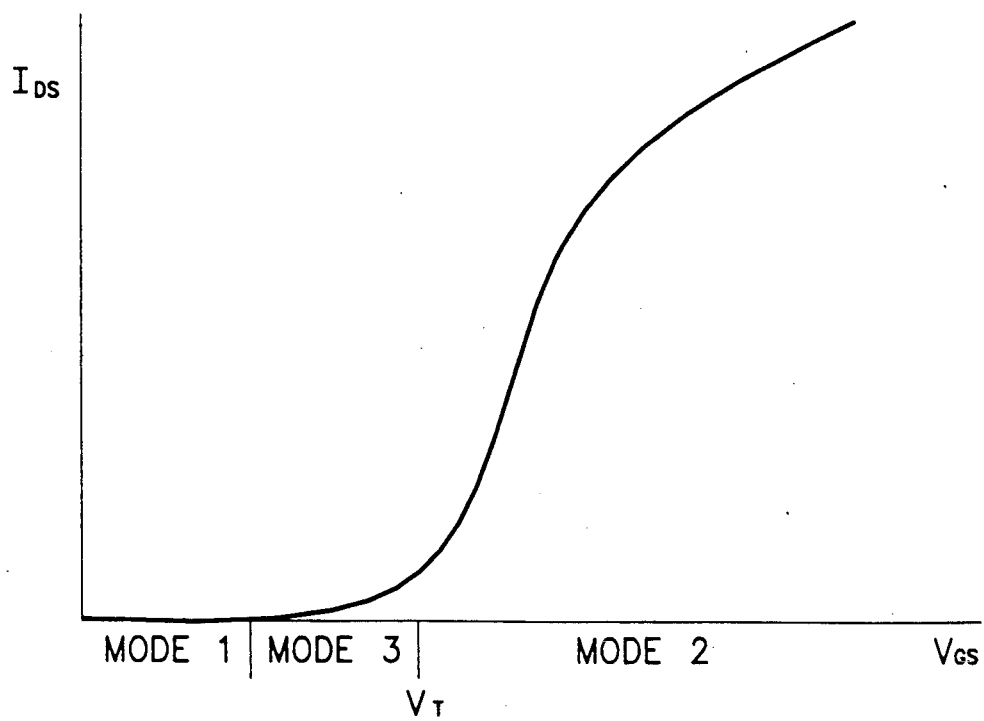
FIG. 2 is an illustration depicting operational characteristics of switches suitable for use with the present invention.

Referring to FIG. 2, a voltage-current (V-I) curve for switching devices suitable for use with the present invention illustrates three operational modes. Typically, the switches, preferably constructed from NMOS or PMOS devices, have a resistance to current flow that depends on both the device size and the operating voltage. In Mode 1, switch is "OFF", and essentially does not conduct current. The gate voltage is usually set to the source voltage. In Mode 2, normally characterized by a threshold voltage (Vt), the switch is considered "ON". Here, conduction of the device has a square-law relationship to the gate-to-source voltage, which is greater than the threshold voltage (Vt) of the device. In Mode 3 (i.e., subthreshold operation), the switching device is "ON", and conduction of the device has an exponential relationship to the gate-to-source voltage. The gate-to-source voltage is lower than the threshold voltage (Vt), however the device is "ON" (weakly conducting). Mode 1 and Mode 2 operations are the most desirable and the most commonly used in contemporary voltage multipliers (doublers).

Figure 1:
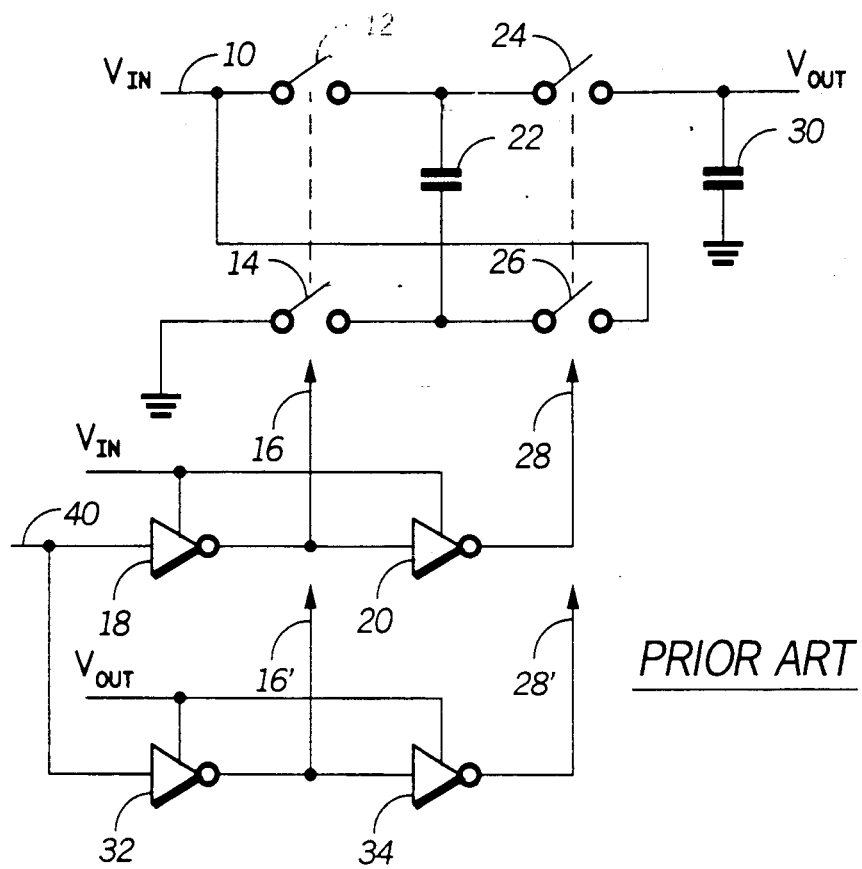
FIG. 1 is a schematic diagram of a conventional voltage multiplier.

To develop a lower switch resistance (higher current handling capability), it is common to "bootstrap" the design by driving the switching devices from the output voltage, as shown in FIG. 1 (16' and 28'). This method also uses a startup control circuit (18 and 20), which operates from the input voltage (Vin) to achieve a minimum output voltage potential for bootstrap operation. Due to the startup circuit's operation on the input voltage (Vin), the switching device's resistance increases rapidly as the input voltage (Vin) approaches the lower portion of Mode 2 operation (about Vt), thereby limiting the minimum startup voltage. Hence, to improve the minimum operational voltage threshold for the device requires a change in the design of conventional voltage multipliers (doublers).

Figure 3:
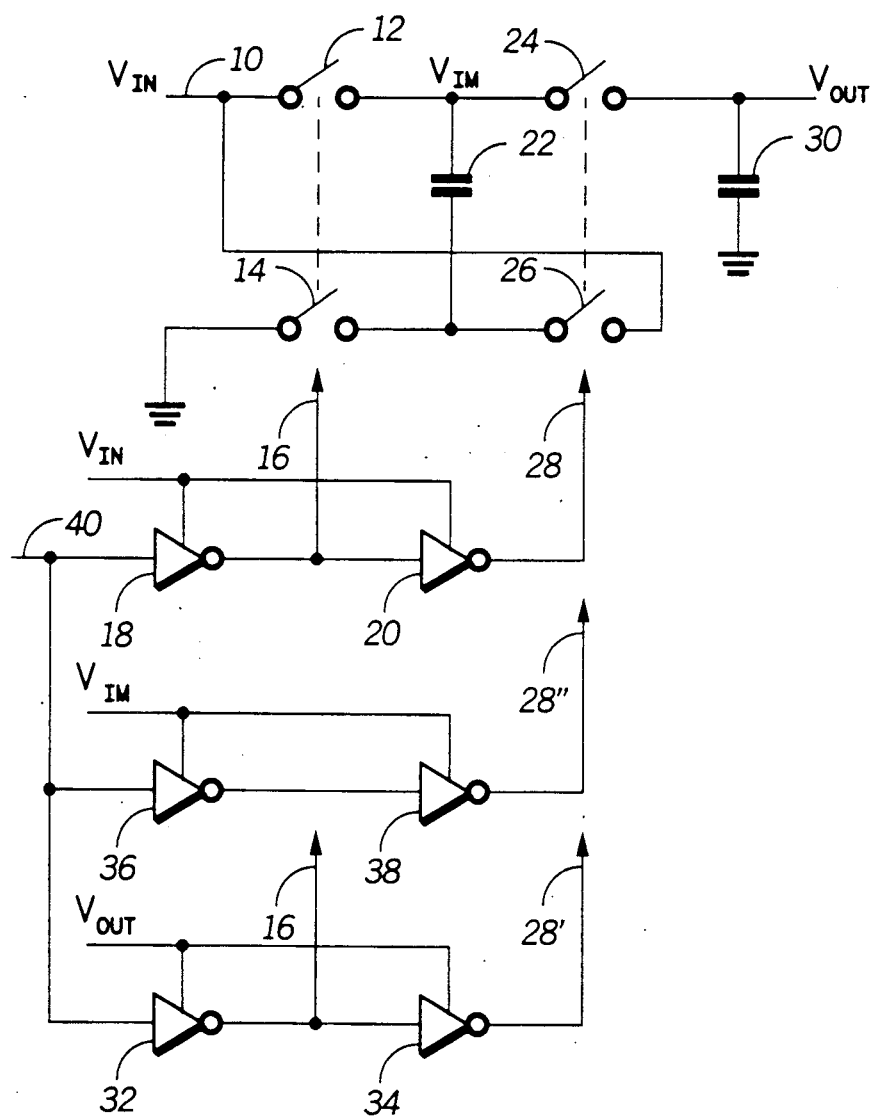
FIG. 3 is a schematic diagram of a voltage multiplier in accordance with the present invention.

Referring to FIG. 3, the preferred topology of the present invention incorporates two secondary bootstrap control circuits (36 and 38) that operate on the intermediate voltage potential of capacitor 22 selectively serially coupled to (added to) the input voltage (Vin). In the inventive voltage multiplier circuit configuration, an incoming voltage (Vin) at the input 10 is selectively transferred to an energy storage device, such as provided by the capacitor 22, using switching devices (12 and 14). The switching devices (12 and 14) are preferably MOS devices that respond to control signals 16 and 16', which are generated by control circuits 18 and 32, respectively. Timing signals from a timing circuit (not shown) are routed to the control circuits (18, 20, 32, 34, 36, and 38) via an input 40 to control the switching speed of the switching circuits (12, 14, 24, and 26).

During an intermediate phase of operation, the switching device 26 is activated in stages, slightly ahead of activating the switching device 24, such that the intermediate voltage potential (Vim) increases at each stage potential (Vim) for its operation. Since the secondary bootstrap circuits (36 and 38) are staged with each successive stage operating on the new (Vim) voltage, the voltage multiplier (doubler) circuit is capable of startup and operation with input voltage (Vin) in the Mode 2 and Mode 3 range of the switching devices (12, 14, 24, and 26).

In the final ("dump") phase, switching devices (24 and 26) are activated by control signals (28, 28', and 28") from control circuits (20, 34, and 38) which are powered from the Vin, Vout, and Vim voltages. The capacitor 30 receives the intermediate voltage potential (Vim) from capacitor 22 selectively serially coupled to (added to) the input voltage potential (Vin). Therefore, the output voltage potential (Vout) progressively approaches twice the input voltage potential (Vin).

The topology of this new voltage multiplying (doubling) circuit allows startup and operation well into the Mode 3 range of the switching devices (12, 14, 24, and 26) due to the secondary bootstrap control circuits (36 and 38). In this way, the present invention may startup and operate at approximately 50 millivolts below the threshold voltage (Vt) of the switching devices (12, 14, 24 and 26). As an example, and not as a limitation, an exemplary embodiment of the present invention was able to operate at approximately 0.8 volts +/−0.2 volts, which is substantially below the input voltage range (e.g., approximately 1.5 volts and above), of conventional voltage multipliers (doublers).

Figure 4:
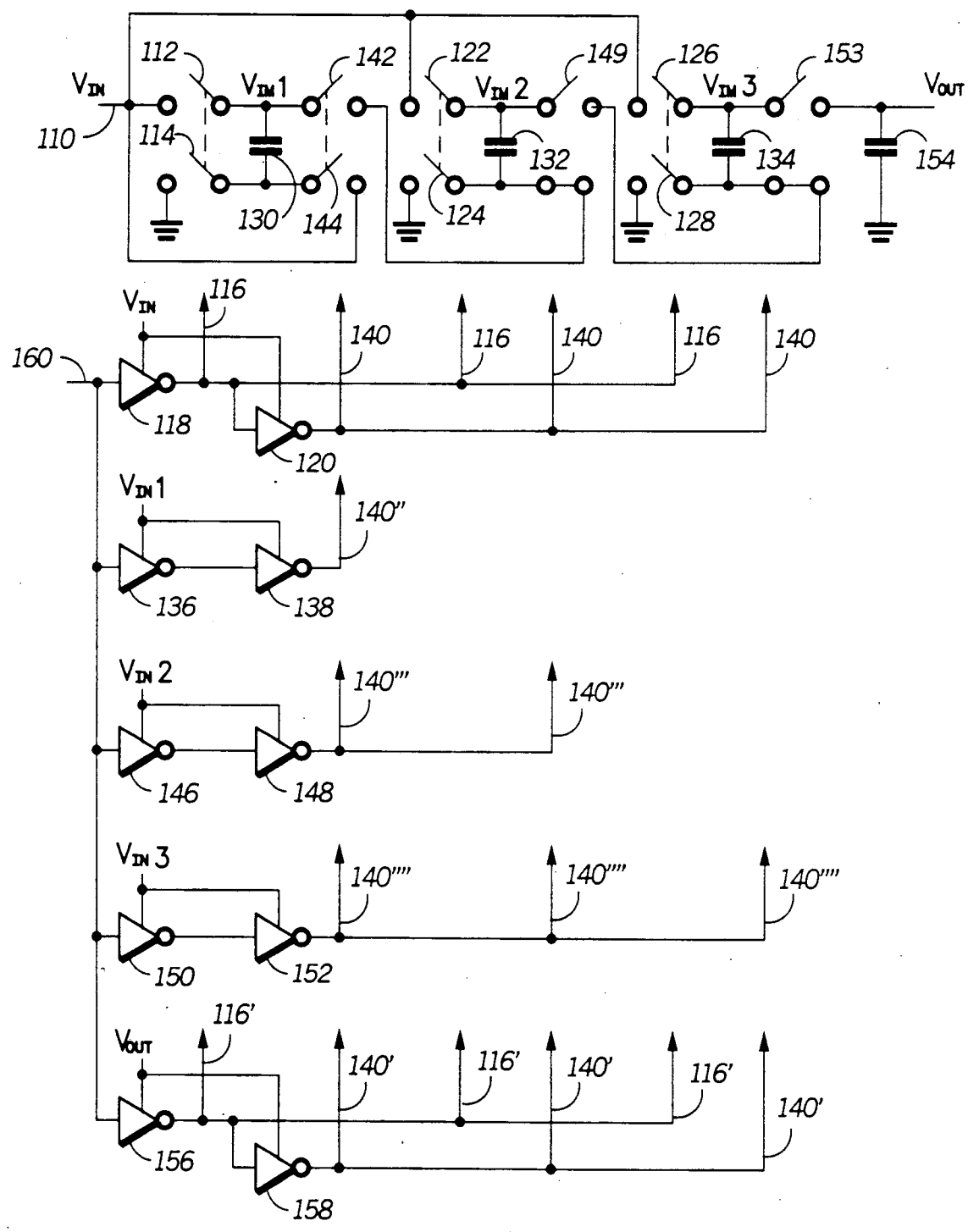
FIG. 4, is a schematic diagram of a voltage multiplier (quadrupler) circuit in accordance with the present invention.

It may be appreciated by one skilled in the art that alternate embodiments of the present invention may incorporate voltage multiplier configurations to generate output voltage potentials other than twice the input voltage potential. Referring to FIG. 4, an exemplary voltage multiplier (quadrupler) circuit is shown.

A quadrupler topology according to the present invention incorporates three intermediate bootstrap control circuits (136, 138, 146, 148, 150, and 152) that operate on the respective intermediate voltage potentials Vim1, Vim2, and Vim3. A startup control circuit (118 and 120) operates on the input voltage potential (Vin) and an "output" bootstrap control circuit (156 and 158) operates on the output voltage potential (Vout). All these control circuits (118, 120, 136, 138, 146, 148, 150, 152, 156, 158) receive timing signals from a timing circuit (not shown) via an input 160 to control the switching speed of a number of switching circuits (112, 114, 122, 124, 126, 128, 142, 144, 149, and 153).

In the inventive voltage quadrupler circuit configuration, an incoming voltage (Vin) at an input 110 is selectively transferred to three energy storage devices, such as provided by three capacitors 130, 132, and 134, using preferably MOS switching devices (112, 114, 122, 124, 126, and 128) which are responsive to control signals 116 and 116'.

Three intermediate phases of operation are characterized by the three intermediate voltage potentials Vim1, Vim2, and Vim3. Switching devices (142 and 144), which are responsive to control signals (140, 140', 140", 140''', and 140''''), generate intermediate voltage potential (Vim1) by selectively serially coupling the energy storage device (capacitor 130) to (adding to) the input voltage potential (Vin). The switching device 144 is activated slightly ahead of activating the switching device 142, such that the intermediate voltage potential (Vim1) may be utilized to supplement control signal 140 with control signal 140", thereby enhancing the current handling capability of the switching devices (142 and 144).

In similar fashion, intermediate voltage potential (Vim2) may result from the energy storage device (capacitor 132) being selectively serially coupled to (added to) the intermediate voltage potential (Vim1). Consequently, control signal 140''' enhances the current handling capability of switching device 149. The control signal 140''' may be regressively applied to the previous stage, further enhancing the current handling capability of switching devices (142 and 144).

The third intermediate voltage potential (Vim3) may be arrived similarly from the energy storage device (capacitor 134) being selectively serially coupled to (added to) the intermediate voltage potential (Vim2). The control devices (150 and 152) thereby provide supplemental control signal 140'''' to the switching device 153 as well as regressively to the switching devices (142, 144, and 149), further enhancing the current handling capability of the switching devices (142, 144, 149, and 153).

Since the intermediate bootstrap circuits (136, 138, 146, 148, 150, and 152) are staged with each successive stage operating on the new (Vim) voltage, the voltage multiplier (quadrupler) circuit is capable of startup and operation with input voltage (Vin) in the Mode 2 and Mode 3 range of the switching devices (112, 114, 122, 124, 126, 128, 142, 144, 149, and 153).

In the final ("dump") phase, the switching device (153) is activated by control signals (140, 140', and 140''') from control circuits (118, 120, 156, 158, 150, and 152) which are powered from the Vin, Vout, and Vim3 voltages. A capacitor 154 receives the intermediate voltage potential (Vim3) from capacitor 134 selectively serially coupled to (added to) the intermediate voltage potential (Vim2). Therefore, the output voltage potential (Vout) is greater than the input voltage potential (Vin) and preferably progressively approaches four times the input voltage potential (Vin).

I claim:

1. A voltage multiplier, comprising:
   an input for receiving an input voltage potential from a voltage source;
   first switching means, coupled to the input, for selectively coupling the input voltage potential to an energy storage means in response to a first control means coupled to the voltage source;
   second switching means, coupled to the first energy storage means, for selectively serially coupling the voltage source and the energy storage means to provide an intermediate voltage potential, and for selectively coupling the intermediate voltage potential to a second energy storage means in response to a second control means coupled to the intermediate voltage potential, the second energy storage means having an output voltage potential greater than the input voltage potential.

2. The voltage multiplier of claim 1, further comprising means for generating a timing signal, the first and second control means responsive to the timing signal.

3. The voltage multiplier of claim 2, further comprising third control means, coupled to the second energy storage means, for providing the first and second control signals in response to the timing signal.

4. A method of multiplying a voltage potential, comprising the steps of:
   (a) selectively coupling a voltage source to a first energy storage means in response to a first control signal provided by a first control means;
   (b) selectively serially coupling the voltage source and the first energy storage means to provide an intermediate voltage potential;
   (c) selectively coupling the intermediate voltage potential to a second energy storage means in response to a second control signal provided by a second control means coupled to the intermediate voltage potential, to provide an output voltage potential.

5. The method of claim 4, further comprising the step of providing a timing signal to the first and second control means.

6. The method of claim 4, further comprising the step of selectively coupling the intermediate voltage potential to a second energy storage means in response to a third control signal provided by a third control means coupled to the output voltage potential.

7. The method of claim 6, further comprising the step of providing a timing signal to the third control means.

* * * * *